(12) United States Patent
Pickett et al.

(10) Patent No.: US 12,520,634 B2
(45) Date of Patent: Jan. 6, 2026

(54) LIGHT-EMITTING DIODE PACKAGES WITH LEAD FRAME STRUCTURES FOR FLIP-CHIP MOUNTING OF LIGHT-EMITTING DIODE CHIPS

(71) Applicant: CreeLED, Inc., Durham, NC (US)

(72) Inventors: Guy Pickett, Durham, NC (US); David Suich, Durham, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 714 days.

(21) Appl. No.: 17/804,648

(22) Filed: May 31, 2022

(65) Prior Publication Data

US 2023/0387356 A1    Nov. 30, 2023

(51) Int. Cl.
*H10H 20/85* (2025.01)
*H10H 20/854* (2025.01)
*H10H 20/857* (2025.01)

(52) U.S. Cl.
CPC ...... *H10H 20/8506* (2025.01); *H10H 20/854* (2025.01); *H10H 20/857* (2025.01)

(58) Field of Classification Search
CPC . H10H 20/8506; H10H 20/854; H10H 20/857
See application file for complete search history.

(56) References Cited

U.S. PATENT DOCUMENTS

| | | | |
|---|---|---|---|
| 2008/0012036 A1* | 1/2008 | Loh | H10H 20/8506 257/E33.001 |
| 2012/0153317 A1 | 6/2012 | Emerson et al. | |
| 2012/0300491 A1 | 11/2012 | Hussell et al. | |
| 2013/0062632 A1* | 3/2013 | Lee | H10H 20/8506 257/E33.056 |
| 2014/0027801 A1 | 1/2014 | Hussell | |
| 2018/0103513 A1* | 4/2018 | Tseng | H10H 20/853 |
| 2018/0269137 A1 | 9/2018 | Oku et al. | |
| 2019/0123247 A1 | 4/2019 | Isono et al. | |

(Continued)

FOREIGN PATENT DOCUMENTS

| | | |
|---|---|---|
| TW | 201630211 A | 8/2016 |
| WO | 2020232668 A1 | 11/2020 |

OTHER PUBLICATIONS

Notice of Allowance for Taiwanese Patent Application No. 112116492, mailed Apr. 24, 2024, 3 pages.

(Continued)

*Primary Examiner* — Jay C Kim
*Assistant Examiner* — Woo K Lee
(74) *Attorney, Agent, or Firm* — Withrow & Terranova, P.L.L.C.

(57) ABSTRACT

Light-emitting diode (LED) packages and more particularly LED packages with lead frame structures for flip-chip mounting of LED chips are disclosed. Lead frame structures include multiple leads with arrangements for LED chips to be flip-chip mounted across neighboring pairs of leads. Arrangements of stress relief features and anchoring features relative to mounting locations are provided in lead frame structures to enhance mechanical integrity of flip-chip bonds during thermal cycling. LED packages may further include housings that are formed about the lead frame structures. Housings may include a recess with recess floor arrangements for positioning of LED chips.

26 Claims, 10 Drawing Sheets

(56) References Cited

U.S. PATENT DOCUMENTS

2020/0118983 A1    4/2020   Pang et al.
2022/0045253 A1    2/2022   Pun et al.
2023/0246144 A1    8/2023   Favale, Jr. et al.

OTHER PUBLICATIONS

International Search Report and Written Opinion for International Patent Application No. PCT/US2023/023741, mailed Sep. 22, 2023, 12 pages.

Office Action for Taiwanese Patent Application No. 112116492, mailed Nov. 23, 2023, 10 pages.

\* cited by examiner

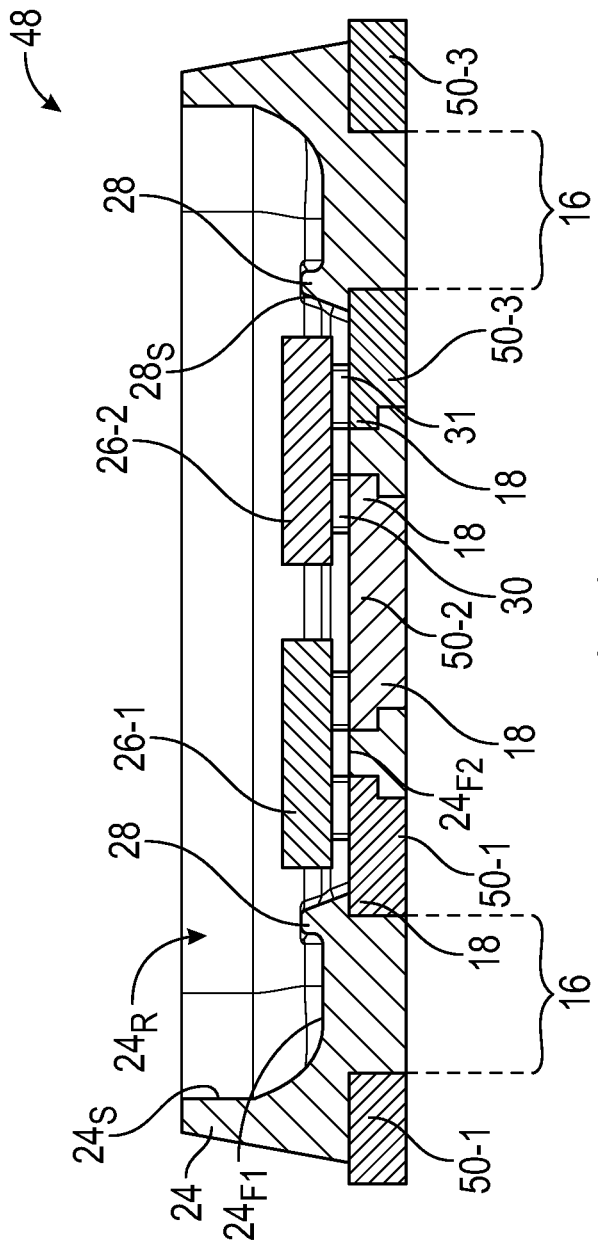
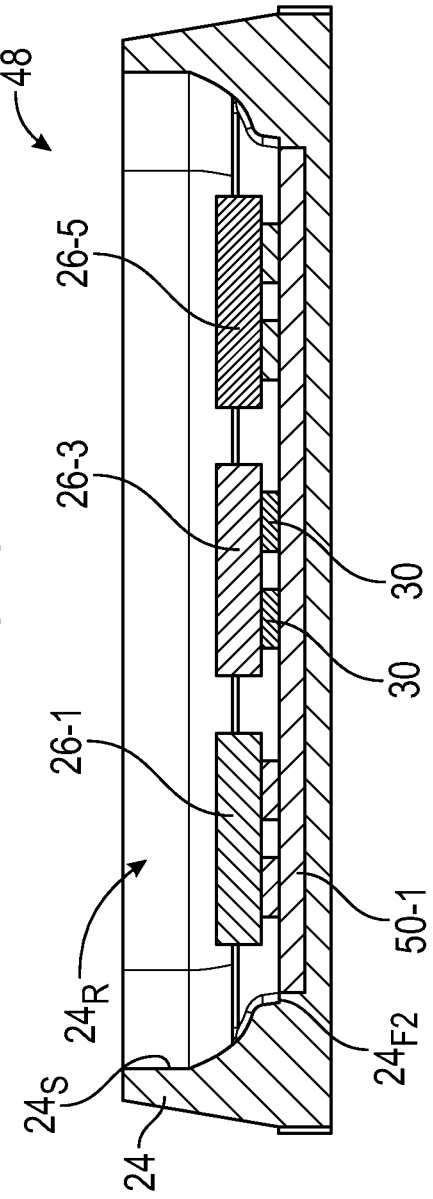
FIG. 4C
FIG. 4D

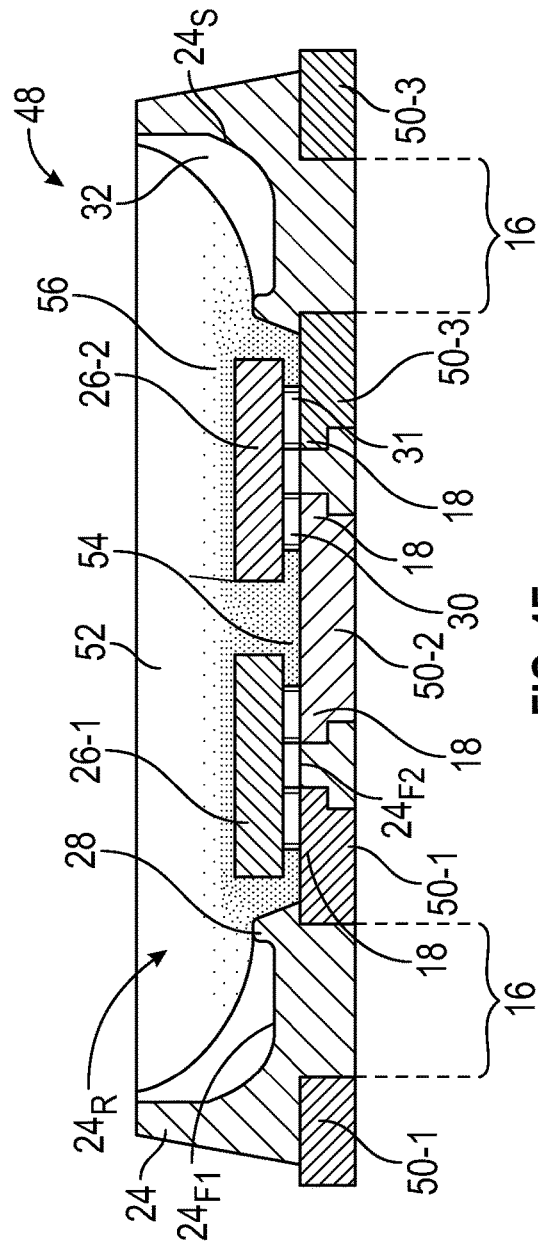
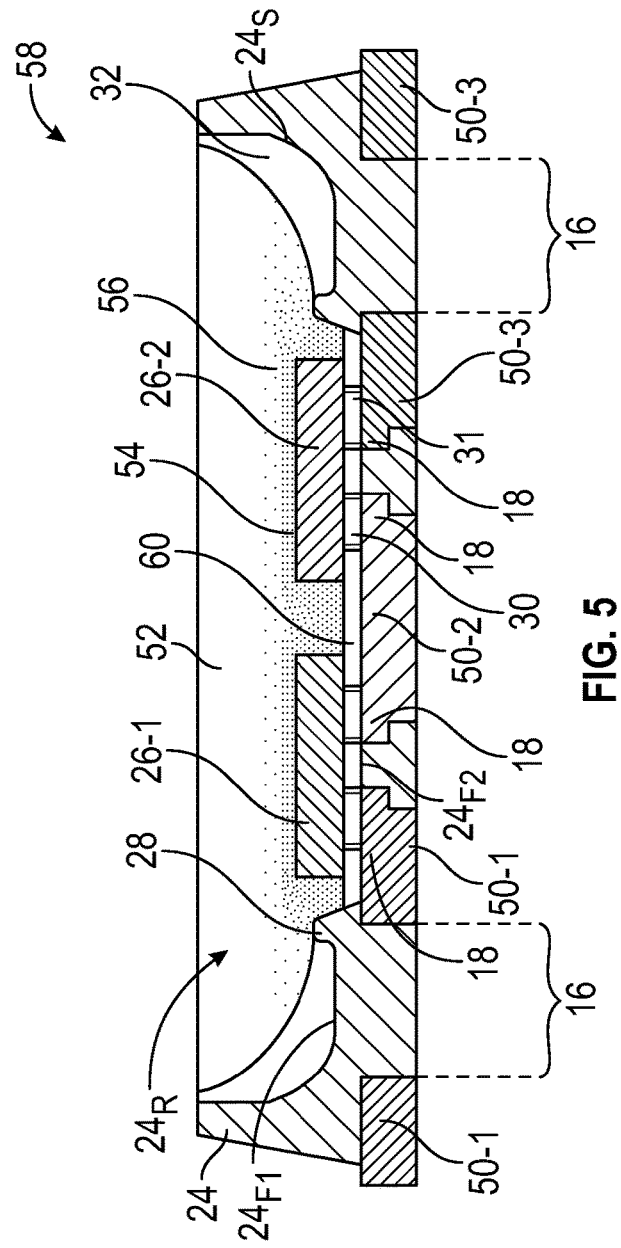

LIGHT-EMITTING DIODE PACKAGES WITH LEAD FRAME STRUCTURES FOR FLIP-CHIP MOUNTING OF LIGHT-EMITTING DIODE CHIPS

FIELD OF THE DISCLOSURE

The present disclosure relates to light-emitting diode (LED) packages, and more particularly to LED packages with lead frame structures for flip-chip mounting of LED chips.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

LED packages are solid-state devices that incorporate one or more LED chips into a packaged device. LED packages have been developed that can provide mechanical support, electrical connections, and encapsulation for LED chips. Lumiphoric materials, such as phosphors, may also be arranged in close proximity to LED emitters to convert portions of light emissions to different wavelengths. Light emissions that exit surfaces of LED emitters typically interact with various elements or surfaces of the LED package and lumiphoric materials before exiting, thereby increasing opportunities for light loss and potential non-uniformity of light emissions.

Typically, it is desirable to operate LED chips and LED packages at the highest light emission efficiencies possible, which can be measured by the emission intensity in relation to the input power (e.g., in lumens per watt). LED packages with increased light output and increased efficiency in compact sizes are increasingly being developed to meet the needs of modern LED technology. However, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to light-emitting diode (LED) packages, and more particularly to LED packages with lead frame structures for flip-chip mounting of LED chips. Lead frame structures include multiple leads with arrangements for LED chips to be flip-chip mounted across neighboring pairs of leads. Arrangements of stress relief features and anchoring features relative to mounting locations are provided in lead frame structures to enhance mechanical integrity of flip-chip bonds during thermal cycling. LED packages may further include housings that are formed about the lead frame structures. Housings may include a recess with recess floor arrangements for positioning of LED chips.

In one aspect, a LED package comprises: a housing that forms a recess with a recess floor and one or more recess sidewalls; a lead frame structure extending through the housing, the lead frame structure comprising a first lead, a second lead, and a third lead; a first LED chip that is flip-chip mounted to a mounting location of the first lead and a mounting location of the second lead; and a second LED chip that is flip-chip mounted to another mounting location of the second lead and a mounting location of the third lead; wherein each of the mounting locations of the first lead, the second lead, and the third lead are surrounded on at least three edges by stress relief features of the lead frame structure. In certain embodiments, the stress relief features comprise one or more of notches and trenches in at least one of the first lead, the second lead, and the third lead. In certain embodiments, the stress relief features comprise notches that extend into the first lead in a first direction to define two opposing edges of the mounting location of the first lead. In certain embodiments, the stress relief features further comprise a trench in the first lead that extends along a length of the first lead in a second direction that is perpendicular to the first direction, the trench defining a third side of the mounting location that is between the two opposing edges. In certain embodiments, a fourth edge of the mounting location of the first lead defines a portion of a gap between the mounting location of the second lead.

The LED package may further comprise a plurality of anchoring features in each of the first lead, the second lead, and the third lead. In certain embodiments, the plurality of anchoring features comprises openings in each of the first lead, the second lead, and the third lead, and portions of the housing reside within each of the openings. In certain embodiments, a first opening in the first lead includes an extension of the first opening that extends toward the mounting location of the first lead. In certain embodiments, the stress relief features comprise a trench in the first lead that extends along a length of the first lead, and the plurality of anchoring features form openings in the first lead that reside within the trench. In certain embodiments, bottom edges of the first lead, the second lead, and the third lead are laterally recessed from edges of the mounting locations. In certain embodiments, the second lead forms a thermal pad that includes one or more openings, and portions of the housing reside within the one or more openings.

The LED package may further comprise an electrical overstress element mounted on the first lead and electrically coupled to the third lead, wherein bottom edges of one or more of the first lead and the second lead are laterally recessed from a mounting location of the electrical overstress element. The LED package may further comprise a ridge that extends upward from the recess floor. In certain embodiments, at least one of the first lead and the third lead form a mounting location for an electrical overstress element, and the ridge extends between the electrical overstress element and the first LED chip. The LED package may further comprise: an electrical overstress element mounted on the first lead and electrically coupled to the third lead; and a light-altering material that is arranged to cover portions of the recess floor that are between the ridge and a sidewall of the recess, wherein the light-altering material is arranged to cover the electrical overstress element. In certain embodiments, a sidewall of the ridge that faces the first LED chip forms an angle from vertical that is in a range from 30 degrees to 75 degrees. The LED package may further comprise: an electrical overstress element mounted on the first lead and electrically coupled to the third lead; and a light-altering material that is arranged within only a portion of the recess floor, wherein the light-altering material is arranged to cover the electrical overstress element.

In another aspect, an LED package comprises: a housing that forms a recess with a first recess floor and a second recess floor that is arranged at a greater depth within the recess than the first recess floor; a lead frame structure extending through the housing, the lead frame structure comprising a first lead, a second lead, and a third lead; a first LED chip that is flip-chip mounted to a mounting location of the first lead and a mounting location of the second lead that are below the first recess floor; and a second LED chip that is flip-chip mounted to another mounting location of the second lead and a mounting location of the third lead that are below the first recess floor. The LED package may further comprise a ridge that is arranged between the first recess floor and the second recess floor, wherein the ridge extends upward into the recess from the first recess floor and the second recess floor. The LED package may further comprise a light-altering material that is arranged to cover the first recess floor from the ridge to a sidewall of the recess. In certain embodiments, the light-altering material forms a curved surface from the ridge to the sidewall of the recess. In certain embodiments, the ridge is one of two ridges, the first LED chip and the second LED chip are arranged between the two ridges, and the light-altering is arranged between the two ridges and the sidewall of the recess. The LED package may further comprise an additional light-altering material that is arranged between the second recess floor and the first LED chip. In certain embodiments, the recess forms a third recess floor that is arranged at a greater depth within the recess than the second recess floor, wherein the mounting locations of the first lead, the second lead, and the third lead are arranged at the third recess floor. The LED package may further comprise a ridge that is arranged between the first recess floor and the second recess floor, wherein the ridge extends upward into the recess from the first recess floor and the second recess floor, and a top surface of the first LED chip is arranged at a height that is the same or less than a height of the ridge. In certain embodiments, each of the mounting locations of the first lead, the second lead, and the third lead is surrounded on at least three edges by stress relief features of the lead frame structure. The LED package may further comprise an encapsulant in the recess, wherein the encapsulant comprises a lumiphoric material.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4C is a cross-section of the LED package of FIG. 4B taken along the sectional line 4C-4C of FIG. 4B.

FIG. 4D is a cross-section of the LED package of FIG. 4B taken along the sectional line 4D-4D of FIG. 4B.

FIG. 4E is a cross-section of the LED package from the perspective of FIG. 4C after the light-altering material and an encapsulant have been formed.

FIG. 5 is a cross-section of an LED package that is similar to the LED package of FIGS. 4A to 4E and further includes an additional layer of light-altering material within the recess.

DETAILED DESCRIPTION

Figure 1A:
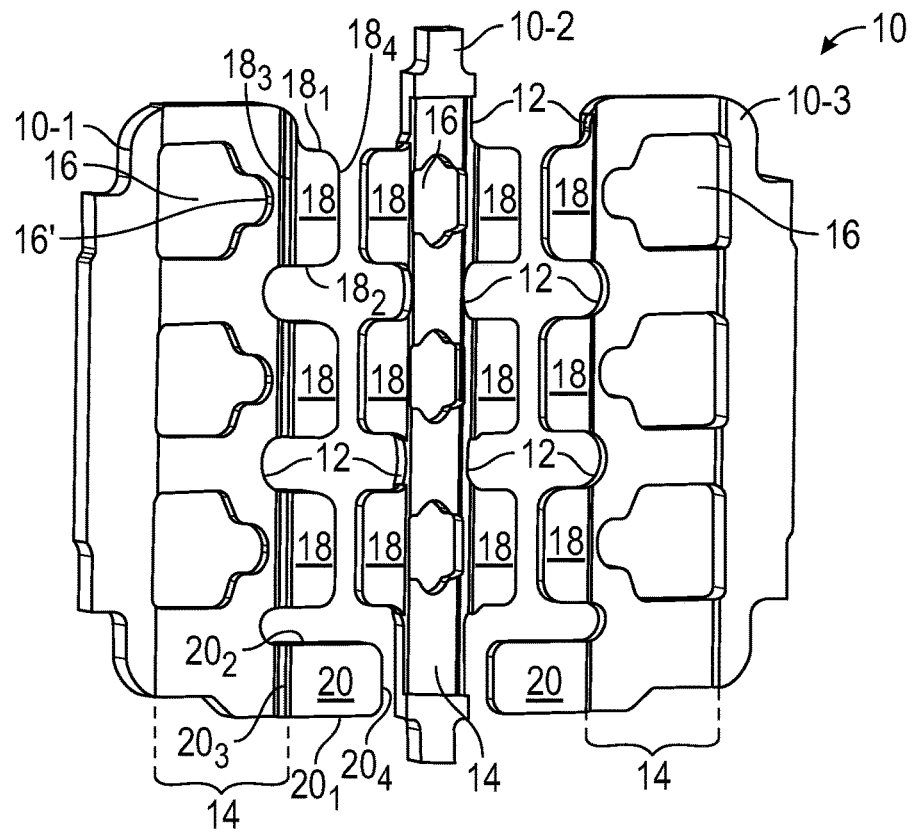
FIG. 1A is a frontside view of a lead frame structure that includes stress relief features and anchoring features according to aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) packages, and more particularly to LED packages with lead frame structures for flip-chip mounting of LED chips. Lead frame structures include multiple leads with arrangements for LED chips to be flip-chip mounted across neighboring pairs of leads. Arrangements of stress relief features and anchoring features relative to mounting locations are provided in lead frame structures to enhance mechanical integrity of flip-chip bonds during thermal cycling. LED packages may further include housings that are formed about the lead frame structures. Housings may include a recess with recess floor arrangements for positioning of LED chips.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN. Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 700 nm. In certain embodiments, the active LED structure may be configured to emit light that is outside the visible spectrum, including one or more portions of the ultraviolet (UV) spectrum, or one or more portions of the near infrared spectrum, and/or the infrared spectrum (e.g., 700 nm to 1000 nm). The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In certain embodiments, a lateral geometry LED chip may embody flip-chip LEDs that are mounted on a surface of an LED package such that the anode and cathode connections are on a face of the active LED structure that is adjacent the mounting surface. In this configuration, a lead frame structure may be incorporated within the LED package for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a lead frame structure, which may also be referred to as a lead frame. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index of refraction that is configured to refract light emissions in a desired direction. In certain aspects, light-reflective particles may also be referred to as light-scattering particles. For light-absorbing materials, the light-altering material may include at least one of carbon, silicon, metal, and organic particles suspended in a binder, such as silicone or epoxy. Such organic particles may include various pigments, dyes, and/or absorptive additives. Thixotropic materials may include one or more of glass fillers, fumed silica and/or fused silica. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder. As used herein, a layer or coating of one or more light-altering materials may be referred to as a light-altering coating. In certain embodiments, a light-altering material or coating may be devoid of lumiphoric materials.

In certain embodiments, aspects of the present disclosure relate to arrangements of light-altering coatings in LED packages, and more particularly to LED packages with lead frame structures that are at least partially encased by a body or housing. A lead frame structure may typically be formed of a metal, such as copper, copper alloys, or other conductive metals. The lead frame structure may initially be part of a larger metal structure that is singulated during manufacturing of individual LED packages. Within an individual LED package, isolated portions of the lead frame structure may form anode and cathode connections for an LED chip. The body or housing may be formed of an insulating material that is arranged to surround or encase portions of the lead frame structure. The body may be formed on the lead frame structure before singulation so that the individual lead frame portions may be electrically isolated from one another and mechanically supported by the body within an individual LED package. The body may form a cup or a recess in which one or more LED chips may be mounted to the lead frame at a floor of the recess. Portions of the lead frame structure may extend from the recess and through the body to protrude or be accessible outside of the body to provide external electrical connections. An encapsulant material, such as silicone or epoxy, may fill the recess to encapsulate the one or more LED chips.

Current high-efficiency mid-power LED packages typically employ lateral geometry LED chips in a lead frame package for cost purposes. Lateral geometry orientations with topside wire bond contacts and polymer-based substrate attach materials provide simple, efficient LED package structures. One approach to increase the efficiency in such LED package structures is to increase an active light-emitting area by increasing a number of LED chips in the LED package.

Additionally, different orientations of LED chips, such as flip-chip LEDs may be used while maintaining the approach of increasing the active light-emitting area of the package. While flip-chip orientations of LED chips typically provide a more efficient LED architecture with higher lumen per watt operation, the LED chips must make direct electrical contact with the lead frame structure. This presents a number of challenges such as a more complex lead frame structures for the LED to bond directly to while maintaining the current forward voltage. Additionally, the use of flip-chip LEDs with direct attachments to the lead frame structure may create higher stress within the LED package due to the different coefficients of thermal expansion between the lead frame structure and die attach solder joints for the LED chips. In this regard, current LED packages with flip-chip LEDs on lead frame structures are typically limited to single LED chips in smaller package footprints, such as 3 millimeters (mm) by 3 mm.

According to aspects of the present disclosure, LED packages with increased amounts of flip-chip LEDs on lead frame structures are provided. In certain aspects, multiple flip-chip LEDs, such as 2 or more, or 3 or more, or 6 or more, may be provided in a single LED package with a lead frame structure. The various leads of the lead frame structures may be arranged to receive and electrically connect flip-chip LEDs in series, parallel, and combinations thereof. In certain embodiments, such LED packages may have larger footprints, such as 5 mm×5 mm while maintaining suitable forward driving voltages. According to aspects of the present disclosure, LED packages are disclosed that include lead frame structures with stress relief features, anchoring features, LED chip alignment features including self-aligning features, and housing features for increased brightness.

FIG. 1A is a frontside view of a lead frame structure 10 that includes stress relief features 12, 14 and anchoring features 16 according to aspects of the present disclosure. The lead frame structure 10 may include three separate leads 10-1 to 10-3, and portions of each lead 10-1 to 10-3 form mounting locations 18 for LED chips that will be later mounted within a single LED package. As used herein, the mounting locations 18 may also be referred to as bond pads of the lead frame structure 10. In the embodiment of FIG. 1A, a first lead 10-1 includes three mounting locations 18, and a second lead 10-2 includes three corresponding and adjacent mounting locations 18. Each pair of the adjacent mounting locations 18 between the first lead 10-1 and the second lead 10-2 collectively form anode and cathode connections for LED chips with flip-chip orientations. As such, LED chips will be flip-chip mounted to the mounting locations 18 such that anodes and cathodes of the LED chips are electrically coupled with corresponding ones of the mounting locations 18 across the first and second leads 10-1, 10-2. In a similar manner, a third lead 10-3 includes three mounting locations 18, and the second lead 10-2 includes three corresponding and adjacent mounting locations 18. Accordingly, the lead frame structure 10 is configured to receive a first row of LED chips that are flip-chip mounted between the first lead 10-1 and the second lead 10-2 and a second row of LED chips that are flip-chip mounted between the second lead 10-2 and the third lead 10-3. In this manner, the first row of LED chips that are flip-chip mounted between the first lead 10-1 and the second lead 10-2 are electrically coupled in parallel with each other, the second row of LED chips that are flip-chip mounted between the second lead 10-2 and the third lead 10-3 are electrically coupled in parallel one another, and the first row of LED chips is electrically coupled in series with the second row of LED chips.

As described above, the use of flip-chip LEDs with direct attachment to the lead frame structure 10 may create higher stress due to different coefficients of thermal expansion between the lead frame structure 10 and die attach materials for the LED chips. In order to mitigate such stress, the stress relief features 12, 14 are provided in several locations adjacent the mounting locations 18. For example, the stress relief features 12 form notches or cut-out portions of the lead frame structure 10 that are adjacent the mounting locations 18. In certain embodiments, opposing boundaries or edges $18_1$, $18_2$ of an individual mounting location 18 within the leads 10-1 to 10-3 are defined by the stress relief features 12 on either side of the mounting location 18. In further embodiments, the stress relief features 12 are arranged to define opposing edges $18_1$, $18_2$ of each of the mounting locations 18 of the lead frame structure 10. In certain embodiments, the stress relief features 14 may form recessed regions or trenches that extend lengthwise along one or more of the leads 10-1 to 10-3. In this manner, the stress relief features 14 may define additional boundaries of the mounting locations 18. For example, the mounting locations 18 may be defined on two opposing edges $18_1$, $18_2$ by the stress relief features 12 in the form of notches that extend into the leads 10-1 to 10-3 in a first direction, and a third edge $18_3$ of the mounting locations 18 may be defined by stress relief features 14 in the form of trenches of the leads 10-1 to 10-3 that extend lengthwise in a second direction that is perpendicular to the first direction. The remaining fourth edge $18_4$ of each mounting location 18 defines a portion of a gap between the adjacent mounting location 18 of a neighboring one of the leads 10-1 to 10-3. By providing the stress relief features 12, 14 that define and effectively surround at least three edges $18_1$ to $18_3$ of the mounting locations 18, structural failure modes associated with thermal stress during operation may be mitigated in a manner sufficient for flip-chip mounting of multiple LED chips.

As further illustrated in FIG. 1A, the anchoring features 16 are provided about each of the leads 10-1 to 10-3. The anchoring features 16 form openings in each of the leads 10-1 to 10-3 that allow material of a housing to be formed therethrough. As such, the anchoring features 16 may further provide mechanical stability to the lead frame structure 10 under thermal stress. The openings may be formed through entire thicknesses of the leads 10-1 to 10-3. In certain embodiments, the anchoring features 16 are provided in locations of each of the leads 10-1 to 10-3 that are adjacent the mounting locations 18. Portions or extensions 16' of the anchoring features 16 may form narrower width extensions of the openings that extend toward the mounting locations 18, thereby increasing anchoring closer to the mounting locations 18 while maintaining structural integrity of the leads 10-1 to 10-3. The anchoring features 16 may even be integrated with the stress relief features 14. As illustrated, each mounting location 18 may accordingly be surrounded on at least three edges $18_1$ to $18_3$ by combinations of the notches or cut-out portions of the stress relief features 12, the recessed regions or trenches of the stress relief features 14, and the anchoring features 16. In this manner, structural failure modes associated with thermal stress during operation may further be mitigated in a manner sufficient for flip-chip mounting of multiple LED chips.

As further illustrated in FIG. 1A, portions of the leads 10-1 and 10-3 form mounting locations 20 for additional electrical elements that may be later mounted. For example, the mounting locations 20 may provide mounting locations for electrical overstress elements, such as electrostatic discharge chips, Zener diodes, and the like. In one arrangement, an electrical overstress element may be mounted to the mounting location 20 of one of the leads 10-1 and 10-3 and wirebonded to the other. In another arrangement, an electrical overstress element may be flip-chip bonded to both of the mounting locations 20. Certain edges $20_2$ and $20_3$ of the mounting locations 20 may be defined by one or more stress relief features 12, 14 in a similar manner as the mounting location 18 for the LED chips, while edges $20_4$ may form parts of a gap with adjacent mounting locations 20 and edges $20_1$ may form peripheral boundaries of the leads 10-1 and 10-3.

Figure 1B:
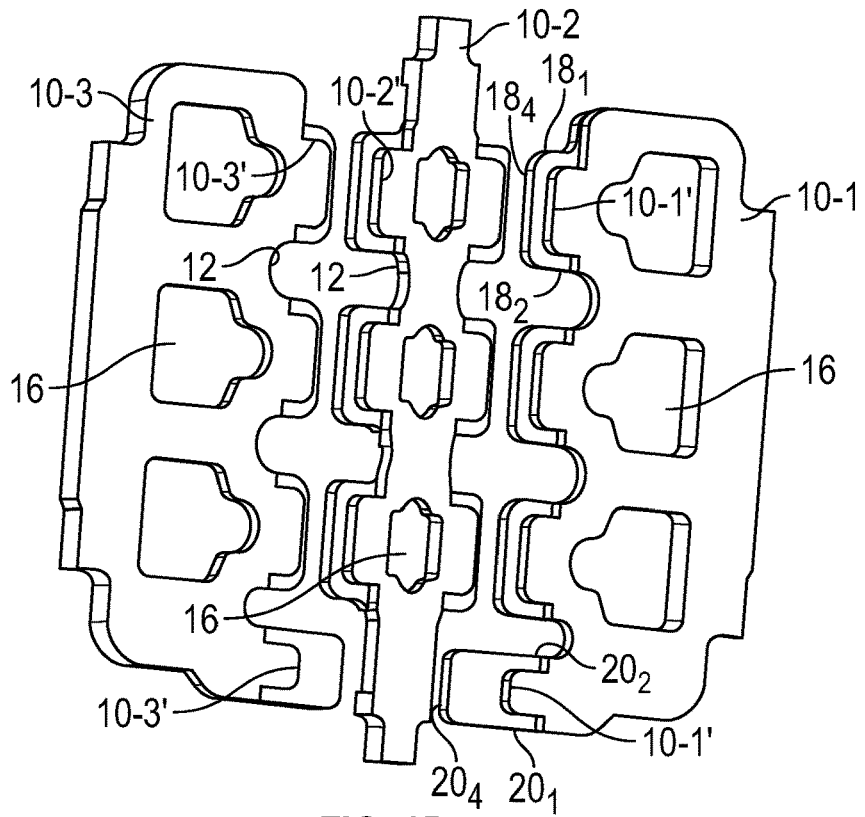
FIG. 1B is a backside view of the lead frame structure of FIG. 1A.

FIG. 1B is a backside view of the lead frame structure 10 of FIG. 1A. Edges $18_1$, $18_2$, and $18_4$ of the mounting locations 18 are visible from the back side view in FIG. 1B. As further illustrated, certain bottom edges 10-1' to 10-3' of each of the leads 10-1 to 10-3 are laterally recessed from the edges $18_1$, $18_2$, and $18_4$ of the mounting locations 18. In this manner, the mounting locations 18 may be formed with increased surface area for mounting with LED chips from the top side to reduce moisture or other condensates from creeping into the mounting locations 18. Accordingly, corrosion associated with such moisture ingress may be reduced. Additionally, recessing the bottom edges 10-1' to 10-3' underneath the mounting locations 18 may further provide increased surface area for adhesion with the later-formed housing. In certain embodiments, certain bottom edges 10-1', 10-3' may be laterally recessed from edges $20_1$, $20_2$, and $20_4$ of the mounting locations 20 in a similar manner.

In certain embodiments, portion of the leads 10-1 and 10-3 are arranged to receive external electrical connections while the middle lead 10-2, along with later mounted LED chips, provides electrically conductive paths between the leads 10-1 and 10-3. As such, the middle lead 10-2 may not be directly coupled to external electrical connections. However, bottom surfaces of the lead 10-2 may form thermal pads for heat dissipation. In this manner, the lead 10-2 may form a thermal pad with one or more anchoring features 16 formed therethrough.

Figure 1C:
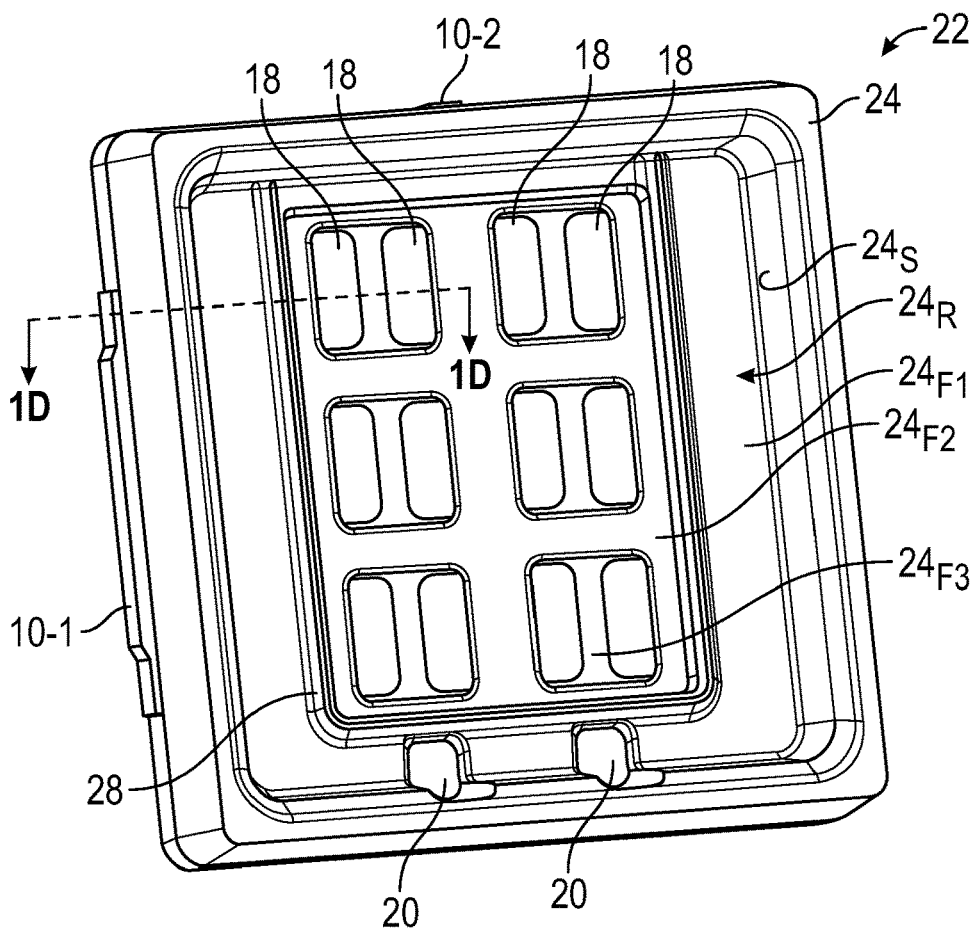
FIG. 1C is a top perspective view of a light-emitting diode (LED) package that includes the lead frame structure of FIGS. 1A and 1B with a housing that at least partially encases the lead frame structure.
Figure 1D:
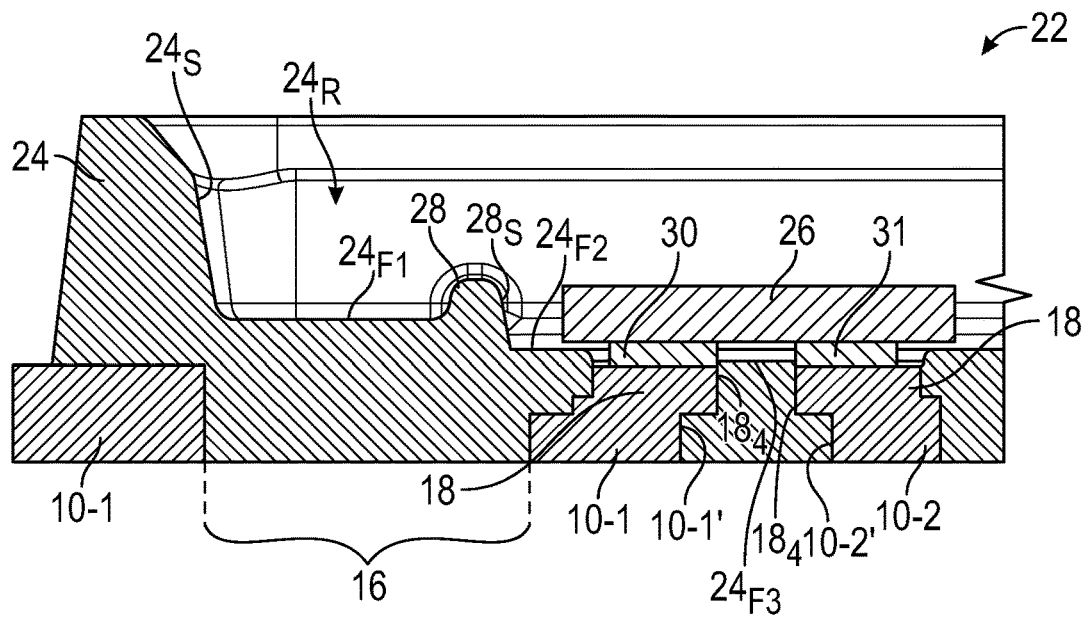
FIG. 1D is a partial cross-section of the LED package of FIG. 1C taken along the sectional line 1D-1D of FIG. 1C with an LED chip mounted thereon.

FIG. 1C is a top perspective view of an LED package 22 that includes the lead frame structure 10 of FIGS. 1A and 1B with a housing 24 that at least partially encases the lead frame structure 10. FIG. 1D is a partial cross-section of the LED package 22 of FIG. 1C taken along the sectional line 1D-1D of FIG. 1C with an LED chip 26 mounted thereon. For illustrative purposes, the LED chip 26 is only shown in the cross-section of FIG. 1D. It is understood that LED chips 26 may be mounted to each of the mounting locations 18 of FIG. 1C and that an electrical overstress element may be mounted to one of the mounting locations 20 and wirebonded to the other mounting location 20. From the cross-section of FIG. 1D, one of the anchoring features 16 is visible between portions of the lead 10-1, thereby allowing portions of the housing 24 to extend through an entire thickness of the lead 10-1 for enhanced mechanical integrity. Additionally, the bottom edges 10-1', 10-2' of the leads 10-1, 10-2 that are laterally recessed from the edges ($18_4$ in FIG. 1D) of the mounting locations 18 allow increased surface area of the housing 24 to be in contact with each of the leads 10-1, 10-2. Furthermore, an increased amount of the housing 24 may reside between portions of the leads 10-1, 10-2 for enhanced mechanical integrity.

As illustrated in FIGS. 1C and 1D, the mounting locations 18 for LED chips and the mounting locations 20 for electrical overstress chips are accessible through the housing 24. In certain embodiments, the housing 24 forms a recess $24_R$ through which the mounting locations 18, 20 are accessible. Within the recess $24_R$, one or more recess floors $24_{F1}$ to $24_{F3}$ of the housing 24 may be formed. The recess floor $24_{F1}$ may be defined where sidewalls $24_S$ of the housing 24 reach a bottom of the recess $24_R$. In certain embodiments, the recess floor $24_{F1}$ may define the only floor of the LED package 22. In other embodiments, the bottom of the recess $24_R$ may form multiple recess floors $24_{F1}$ to $24_{F3}$ that are segregated from one another and/or arranged at different depths within the recess $24_R$.

In certain aspects, a retention structure in the form of a ridge 28 may be arranged within the recess $24_R$ to define a boundary between the recess floors $24_{F1}$ and $24_{F2}$. The ridge 28 may extend upward from the housing 24 at one or more of the recess floors $24_{F1}$ and $24_{F2}$. The ridge 28 may comprise a same material of the housing 24 such that the ridge 28 is an extension of the housing 24. In this regard, the ridge 28 may be formed concurrently with the housing 24, such as during a molding process of the housing 24 around the leads 10-1 to 10-3. In other embodiments, the ridge 28 may comprise a different material than the housing 24 such that the ridge 28 is formed after the housing 24 is provided around the leads 10-1 to 10-3. The ridge 28 may be formed around one or more sides of the array of mounting locations 18. For example, in FIG. 1C, the ridge 28 is arranged around three sides of the array of mounting locations 18 and together with the recess sidewall $24_S$, a raised boundary is formed about the entire array of mounting locations 18 that defines an overall light-emitting surface for the LED package 22. In this manner, the recess floor $24_{F1}$ may be arranged with different materials than other portions of the recess $24_R$, including for example light-altering materials as will be later described in greater detail. As illustrated, the ridge 28 may extend between the mounting locations 18 and the mounting locations 20 to segregate electrical overstress elements from the light-emitting surface.

In certain embodiments, the recess floor $24_{F2}$ may be defined within the boundaries of the ridge 28 as best illustrated in FIG. 1D. Additionally, the recess floor $24_{F3}$ may arranged along a plane where the mounting locations 18 of the leads 10-1 to 10-3 are exposed through the housing 24. In certain embodiments, the mounting locations 18 may be coplanar with the recess floor $24_{F3}$. As illustrated in FIG. 1D, the recess floor $24_{F1}$ may be arranged at a first depth within the recess $24_R$, the recess floor $24_{F2}$ may be arranged at a second depth within the recess $24_R$ that is greater than the first depth, and the recess floor $24_{F3}$ may be arranged at a third depth within the recess $24_R$ that is greater than the second depth. In this manner, the bottom of the recess $24_R$ forms a recess depth that is progressively deeper with increasing lateral distance from the recess sidewalls $24_S$. In certain embodiments, such an arrangement may advantageously provide a top surface of the LED chip 26 at a desired height for the LED package 22, for example at a height that is the same or less than a height of the ridge 28. In such an arrangement, the outline of the ridge 28 may serve to define the light-emitting surface of the LED package 22 and/or provide more narrow emissions for the LED package 22. In other embodiments, the top surface of the LED chip 26 may be provided at a height that exceeds the height of the ridge 28 in order to provide wider emissions from the LED package 22.

As illustrated, the recess floor $24_{F3}$ forms a deepest portion of the recess $24_R$ where the LED chip 26 is mounted to the leads 10-1, 10-2. In certain embodiments, bond pads 30, 31 for the LED chip 26 may extend past a horizontal plane defined by the recess floor $24_{F2}$, thereby indexing the LED chip 26 lower within the housing 24. In FIG. 1D, portions of the LED chip 26 are arranged to laterally overhang the recess floor $24_{F2}$, while the bond pads 30, 31 extend to the recess floor $24_{F3}$. In FIG. 1D, one of the bond pads 30 or 31 may embody an anode bond pad of the LED chip 26 while the other of the bond pads 30 or 31 may embody a cathode bond pad of the LED chip 26. In certain embodiments, the housing 24 may exhibit increased reflectivity compared to the leads 10-1, 10-2. By providing the lateral overhang of the LED chip 26, increased brightness may be provided for the LED package 22 since increased amounts of the housing 24 are positioned underneath the LED chip 26.

In certain embodiments, sidewalls $28_S$ of the ridge 28 that face the LED chips 26 may be angled to further control targeted emission patterns. For example, an angle of the sidewalls $28_S$ may be in a range from 30° to 90° from vertical depending on the desired light shaping. As illustrated in FIG. 1C, the sidewalls $28_S$ may have a slope defined by an angle in a range from 65° to 90°, or 75° to 90°, from vertical to narrow the emission from the LED package 22.

Figure 1E:
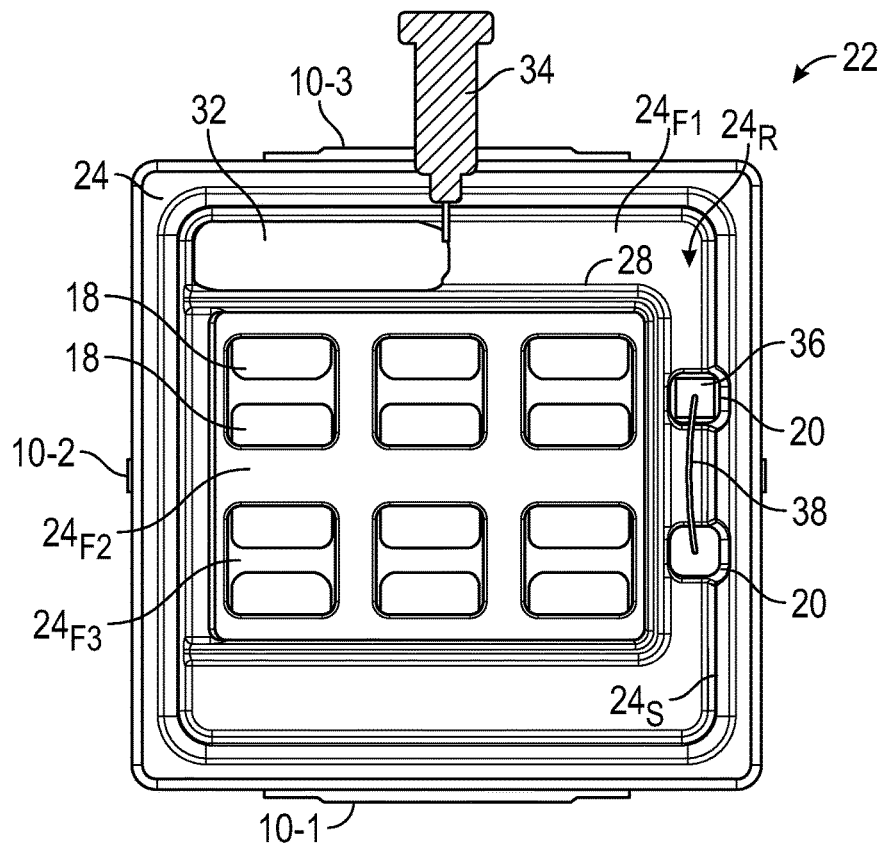
FIG. 1E is top view of the LED package of FIG. 1C at a fabrication step where a light-altering material is arranged within the recess.

FIG. 1E is top view of the LED package 22 of FIG. 1C at a fabrication step where a light-altering material 32 is arranged within the recess $24_R$. As previously described, the light-altering material 32 may include light-reflective materials that reflect or redirect light, light-absorbing materials that absorb light, materials that act as a thixotropic agent, and combinations thereof. For light-reflective applications, the light-altering material 32 may have a generally white color. For light-absorbing applications, the light-altering material 32 may have a generally dark or black color. In still further applications where the light-altering material 32 comprises both light-reflective materials and light-absorbing materials, the light-altering material 32 may have a generally white color with some amount of dark particles mixed therein. The light-altering material 32 may be applied via a dispensing tool 34, among other application techniques. In certain embodiments, the light-altering material 32 may be dispensed between the ridge 28 and the recess sidewalls $24_S$ such that the ridge 28 forms a dam that retains the light-altering material 32 during dispensing and defines a boundary thereof. An electrical overstress element 36 is shown being mounted to the mounting location 20 of the lead 10-3 and electrically coupled to the mounting location 20 of the lead 10-1 via a wire bond 38. As illustrated, the electrical overstress element 36 is arranged between the ridge 28 and one of the recess sidewalls $24_S$. In this manner, the light-altering material 32 may be dispensed to cover the electrical overstress element 36 and the wire bond 38, thereby arranging such elements out of the light path from the LED package 22.

Figure 1F:
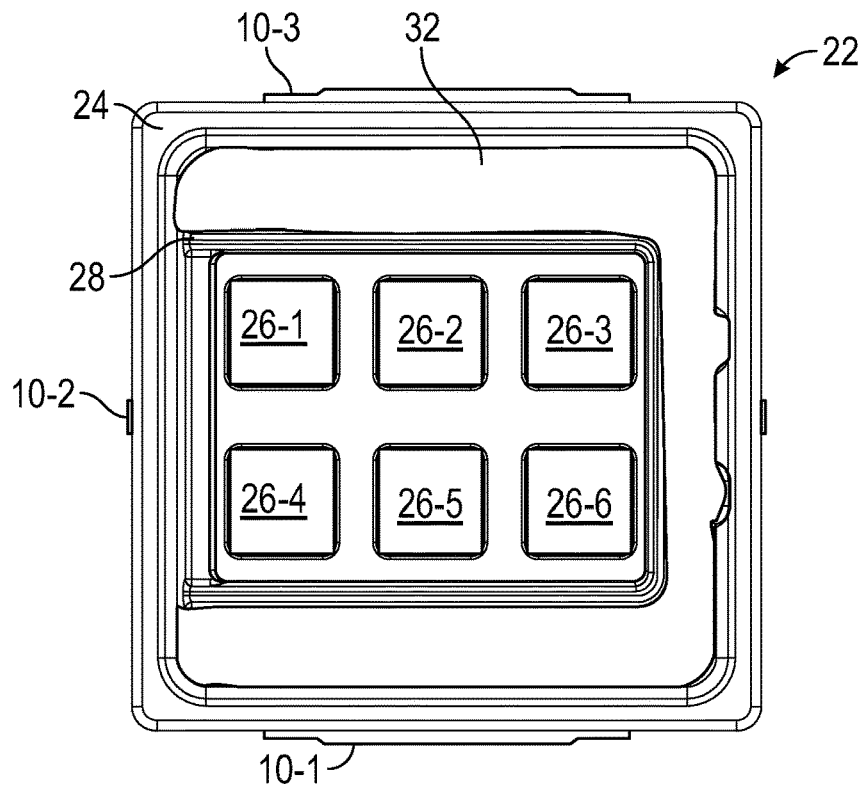
FIG. 1F is a top view of the LED package of FIG. 1E after the light-altering material is provided and a plurality of LED chips are mounted.

FIG. 1F is a top view of the LED package 22 of FIG. 1E after the light-altering material 32 is provided and a plurality of LED chips 26-1 to 26-6 are mounted. As illustrated, the light-altering material 32 is arranged to entirely cover the electrical overstress element 36 and the wire bond 38 (visible in FIG. 1E). In this manner, a light-emitting surface for the LED package 22 may be defined by a boundary of the light-altering material 32, or the ridge 28, and at least one of the recess sidewalls $24_S$ such that the boundary encloses a periphery of an array formed by the LED chips 26-1 to 26-6.

Figure 2A:
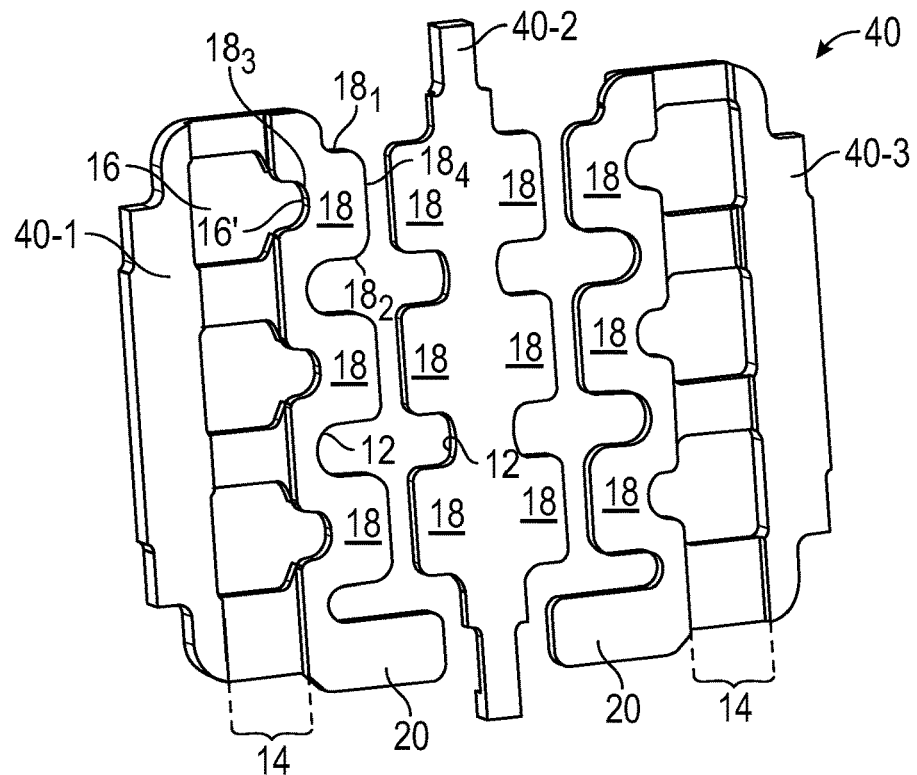
FIG. 2A is a frontside view of a lead frame structure that is similar to the lead frame structure of FIG. 1A with an alternative arrangement of stress relief features and anchoring features.

FIG. 2A is a frontside view of a lead frame structure 40 that is similar to the lead frame structure 10 of FIG. 1A with an alternative arrangement of stress relief features 12, 14 and anchoring features 16. The lead frame structure 40 includes a first lead 40-1, a second lead 40-2, and a third lead 40-3 that are arranged to receive LED chips in similar manner as described above for the lead frame structure 10 of FIG. 1A. In FIG. 2A, the second lead 40-2 does not include anchoring features 16 or stress relief features 14 that form recessed regions or trenches therethrough. Rather, the frontside of the second lead 40-2 is generally planar and includes stress relief features 12 that define opposing edges $18_1$ and $18_2$ of the mounting locations 18. A portion of the edge $18_3$ may be defined by the anchoring feature 16 and in particular by the extension 16' as previously described. The stress relief features 14 are provided along the leads 40-1 and 40-3 in a similar manner as FIG. 1A.

Figure 2B:
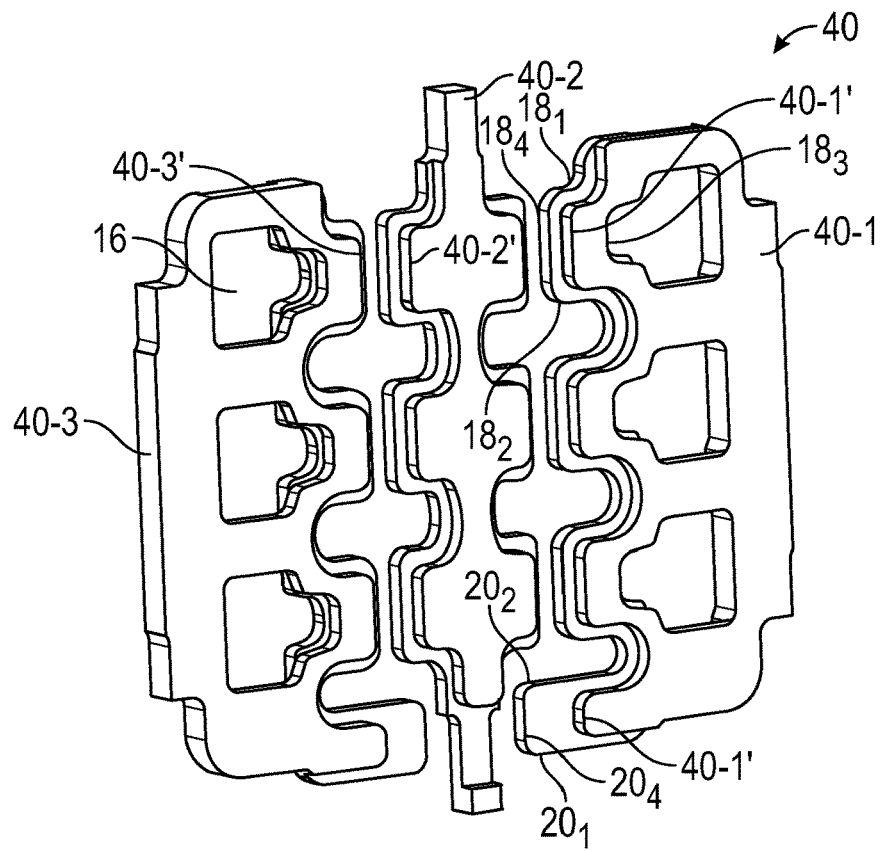
FIG. 2B is a backside view of the lead frame structure of FIG. 2A.

FIG. 2B is a backside view of the lead frame structure 40 of FIG. 2A. As illustrated, certain bottom edges 40-1' to 40-3' of each of the leads 40-1 to 40-3 are laterally recessed from the edges $18_1$, $18_2$, and $18_4$ of the mounting locations 18 in a similar manner as described for FIG. 1B. Additionally, certain bottom edges 40-1', 40-3' of the leads 40-1 and 40-3 may be laterally recessed from edges $20_1$, $20_2$, and $20_4$ of the mounting locations 20 in a similar manner.

Figure 2C:
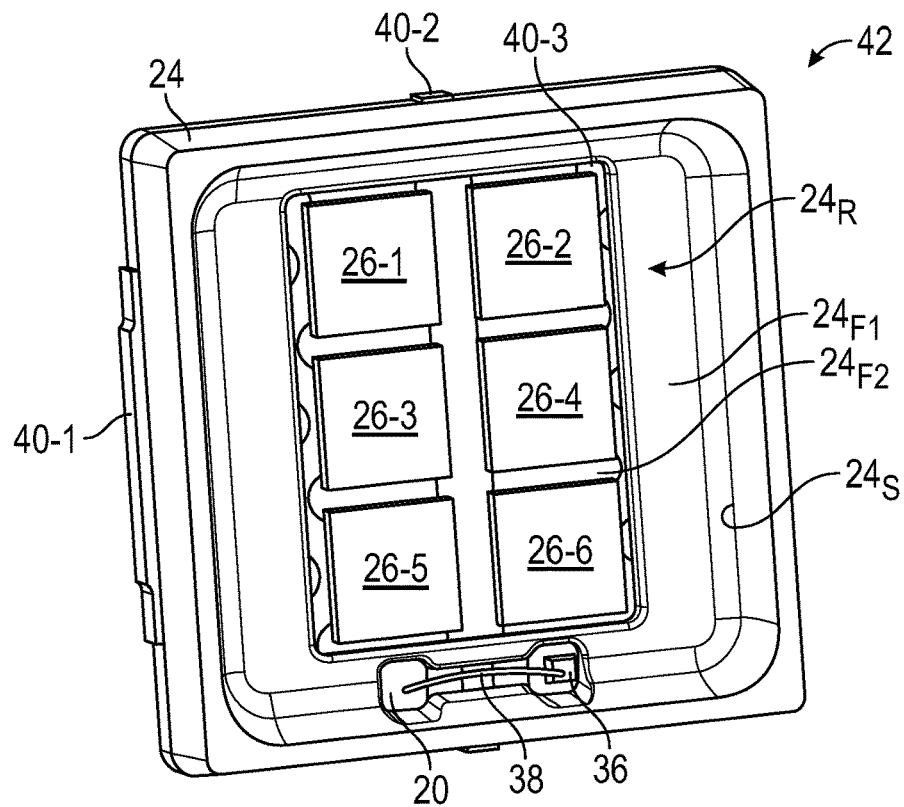
FIG. 2C is a top perspective view of an LED package that includes the lead frame structure of FIGS. 2A and 2B with a housing that at least partially encases the lead frame structure.

FIG. 2C is a top perspective view of an LED package 42 that includes the lead frame structure 40 of FIGS. 2A and 2B with the housing 24 that at least partially encases the lead frame structure 40. In the LED package 42, the ridge 28 of FIG. 1C is omitted and the housing 24 may include light-reflective materials, light-absorbing materials, or combinations thereof. The first recess floor $24_{F1}$ is arranged from the recess sidewalls $24_S$ to positions around a perimeter of the array of LED chips 26-1 to 26-6. The second recess floor $24_{F2}$ is arranged at a deeper portion of the recess $24_R$ such that the LED chips 26-1 to 26-6 are mounted to portions of the leads 40-1 to 40-3 at the second recess floor $24_{F2}$. As illustrated, the mounting locations 20, the electrical overstress element 36, and the wire bond 38 may be arranged within the recess $24_R$ and outside the array of LED chips 26-1 to 26-6.

Figure 2D:
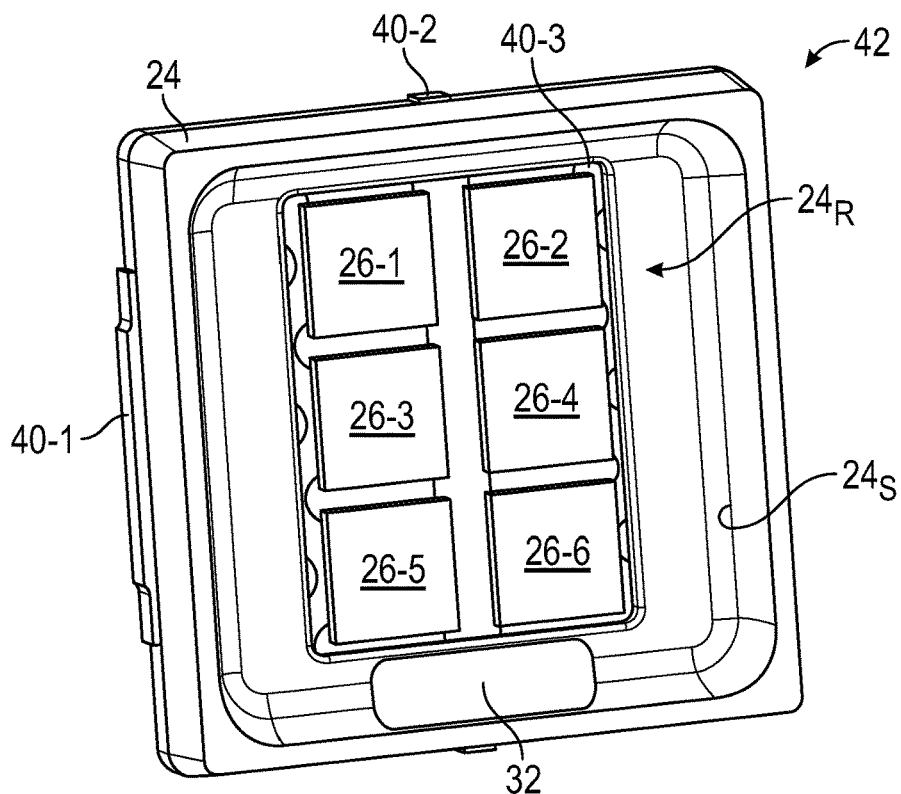
FIG. 2D is top view of the LED package of FIG. 2C after the light-altering material is arranged within a portion of the recess.

FIG. 2D is top view of the LED package 42 of FIG. 2C after the light-altering material 32 is arranged within a portion of the recess $24_R$. As illustrated, the light-altering material 32 is arranged to only cover the mounting locations 20, the electrical overstress element 36, and the wire bond 38 within the recess $24_R$, thereby reducing associated absorption with these elements while also using a reduced amount of the light-altering material 32.

Figure 3A:
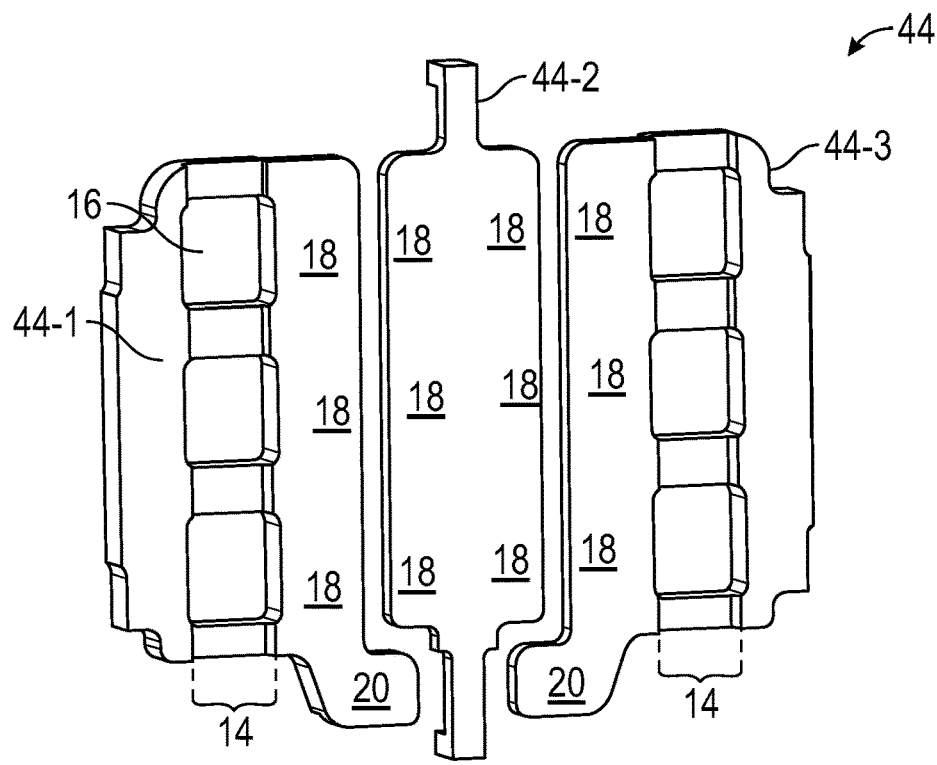
FIG. 3A is a frontside view of a lead frame structure that is similar to the lead frame structure of FIG. 2A with an alternative arrangement of stress relief features and anchoring features.

FIG. 3A is a frontside view of a lead frame structure 44 that is similar to the lead frame structure 40 of FIG. 2A with an alternative arrangement of stress relief features 14 and anchoring features 16. As illustrated, the lead frame structure 44 does not include the stress relief features 12 of FIG. 2A, thereby providing more linear gaps between adjacent mounting locations 18 of adjacent ones of the leads 44-1 to 44-3. In this regard, an increased surface area for mounting LED chips may be provided. The stress relief features 14 are provided along the leads 44-1 and 44-3 in a similar manner as FIGS. 1A and 2A.

Figure 3B:
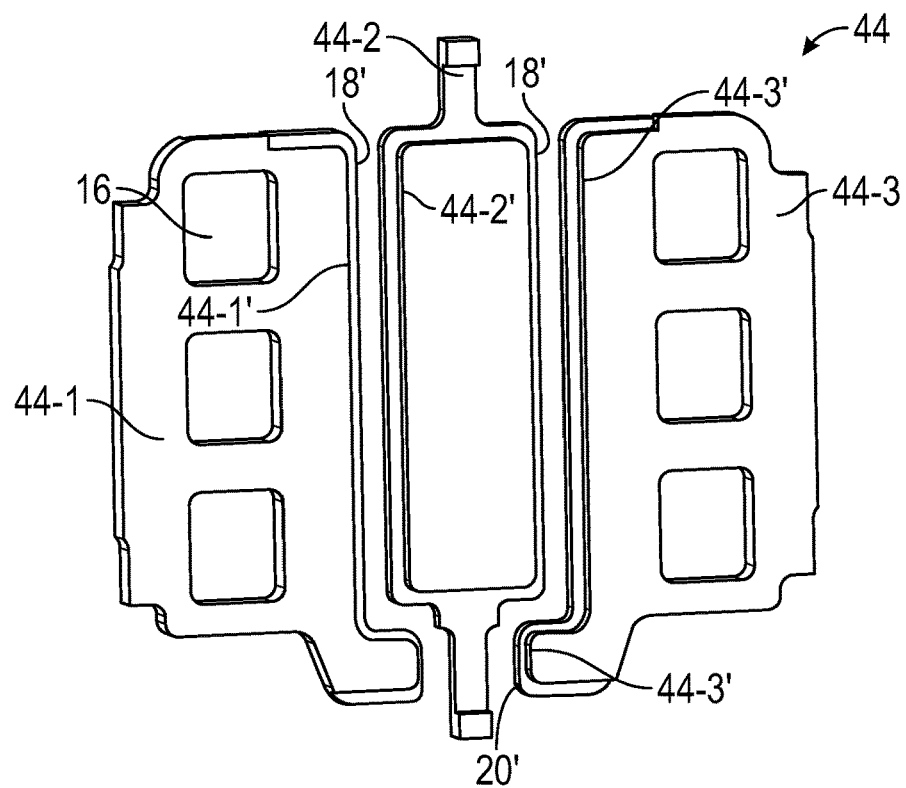
FIG. 3B is a backside view of the lead frame structure of FIG. 3A.

FIG. 3B is a backside view of the lead frame structure 44 of FIG. 3A. As illustrated, bottom edges 44-1' to 44-3' of each of the leads 44-1 to 44-3 are laterally recessed from edges 18' of the mounting locations 18 in a similar manner as described above, only with a more linear shape. In this manner, the leads 44-1 to 44-3 may be provided with increased material in regions beneath the LED chips, thereby providing increased thermal dissipation during operation. Additionally, certain bottom edges 44-1', 44-3' of the leads 44-1, 44-3 may be laterally recessed from edges 20' of the mounting locations 20 in a similar manner as described above.

Figure 3C:
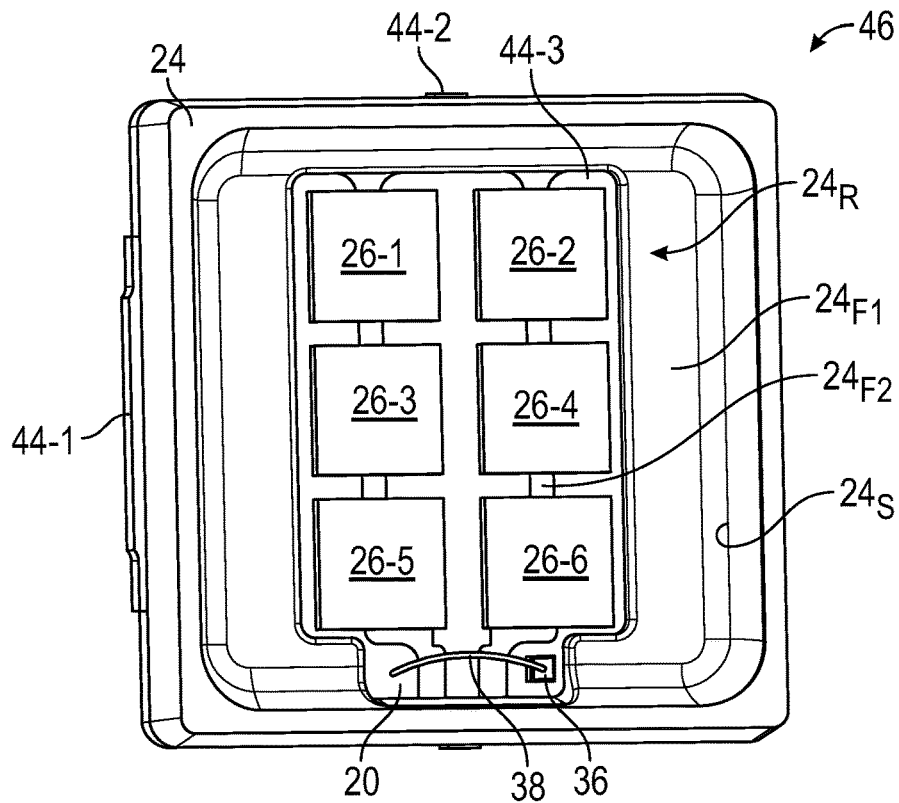
FIG. 3C is a top perspective view of an LED package that includes the lead frame structure of FIGS. 3A and 3B with a housing that at least partially encases the lead frame structure.

FIG. 3C is a top perspective view of an LED package 46 that includes the lead frame structure 44 of FIGS. 3A and 3B with the housing 24 that at least partially encases the lead frame structure 44. The LED package 46 is similar to the LED package 42 of FIG. 2C, except the mounting locations 20, the electrical overstress element 36, and the wire bond 38 may be arranged within the recess $24_R$ and along the second recess floor $24_{F2}$. In this manner, the electrical overstress element 36 may be mounted along a same plane of the LED package 46 as the LED chips 26-1 to 26-6.

Figure 3D:
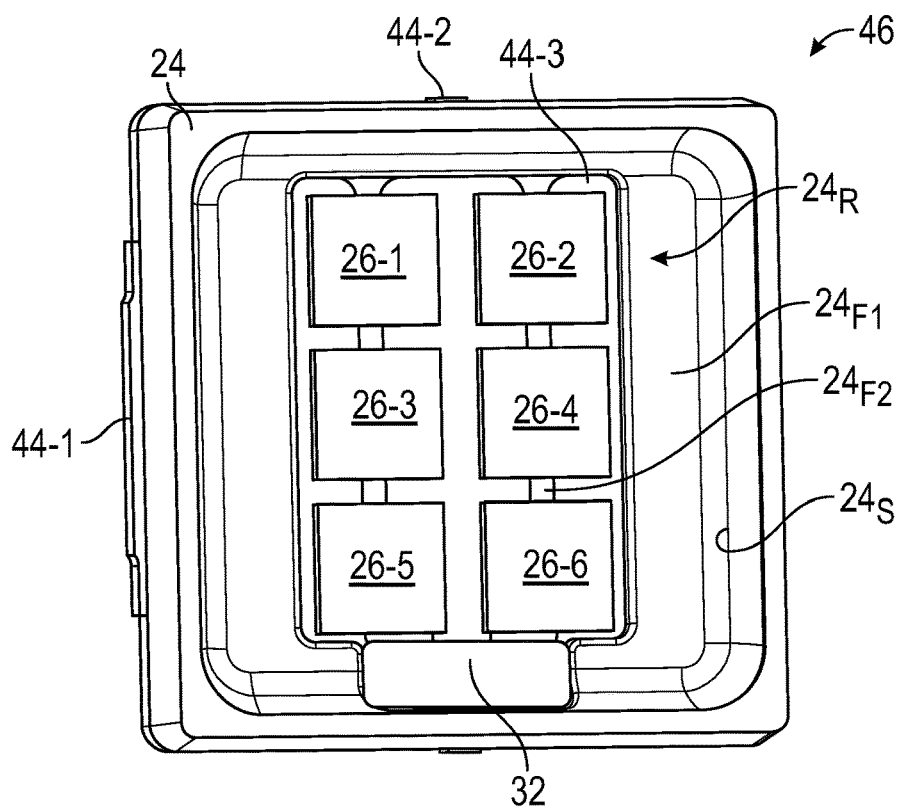
FIG. 3D is top view of the LED package of FIG. 3C after a light-altering material is arranged within a portion of the recess.

FIG. 3D is top view of the LED package 46 of FIG. 3C after the light-altering material 32 is arranged within a portion of the recess $24_R$. As illustrated, the light-altering material 32 is arranged to only cover the mounting locations 20, the electrical overstress element 36, and the wire bond 38 within the recess $24_R$ and along the second recess floor $24_{F2}$. In this manner, the location of the light-altering material 32 may be similar to the LED package 42 of FIG. 2D except that the light-altering material 32 may be provided at a lower height within the LED package 46.

Figure 4A:
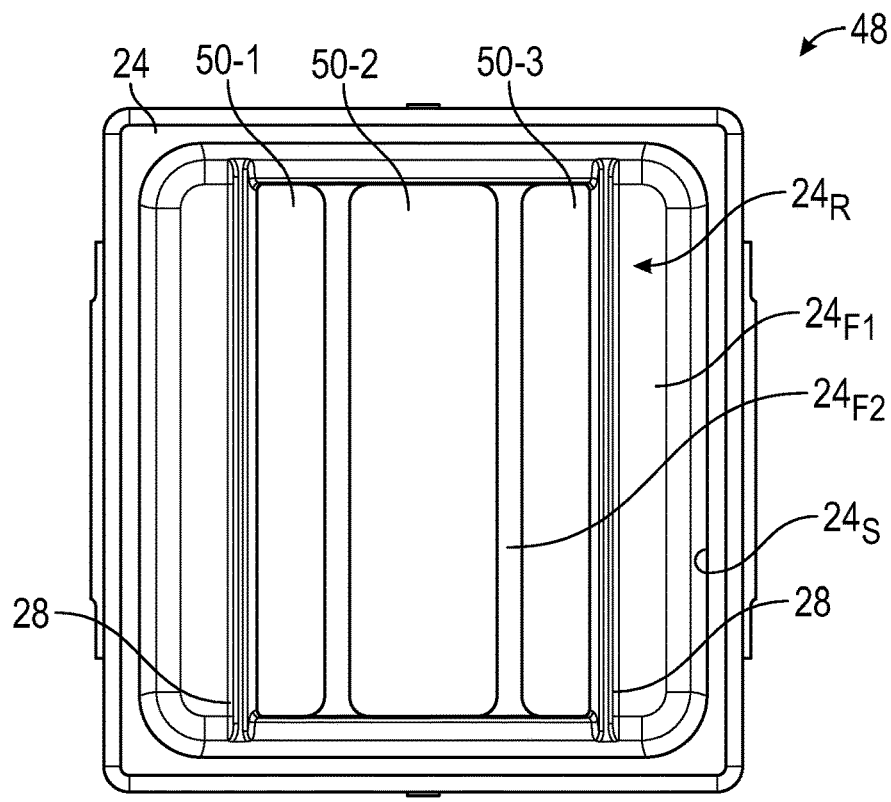
FIG. 4A is a top view of an LED package that includes a lead frame formed by leads with a housing and one or more ridges.
Figure 4B:
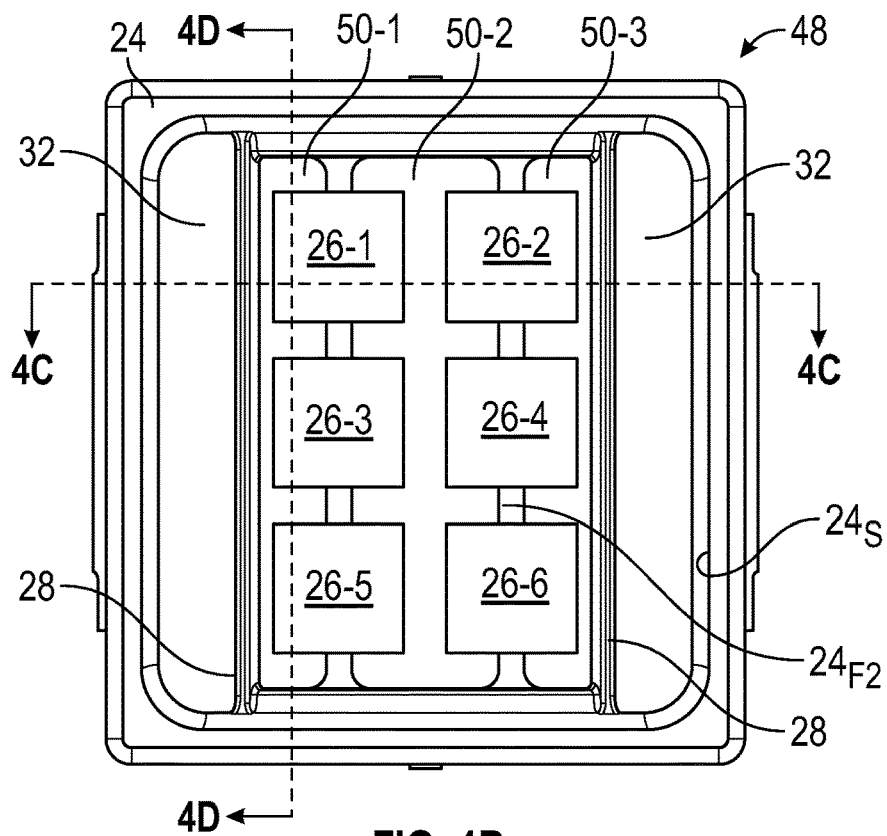
FIG. 4B is a top view of the LED package of FIG. 4A after a light-altering material has been arranged along portions of the housing that are between the ridges and recess sidewalls.

FIG. 4A is a top view of an LED package 48 that includes a lead frame formed by leads 50-1 to 50-3 with the housing 24 and one or more ridges 28 as described above for FIG. 1C. The lead frame formed by the leads 50-1 to 50-3 may be the same as the lead frame structure 44 of FIGS. 3A to 3D, except the mounting locations 20 for the electrical overstress element 36 of FIGS. 3A to 3D are omitted. In this regard, the LED package 48 may not include the electrical overstress element 36 as previously described, although it could be added in certain embodiments. As illustrated, ridges 28 may be placed on opposing sides of the array of LED chips 26-1 to 26-6. In this manner, the ridges 28 may connect opposing recess sidewalls $24_S$ of the housing 24, thereby defining a light-emitting area therebetween. FIG. 4B is a top view of the LED package 48 after the light-altering material 32 has been arranged along portions of the housing 24 that are between the ridges 28 and the recess sidewalls $24_S$, thereby covering the recess floor $24_{F1}$, while leaving the recess floor $24_{F2}$ uncovered by the light-altering material 32.

FIG. 4C is a cross-section of the LED package 48 of FIG. 4B taken along the sectional line 4C-4C of FIG. 4B. For illustrative purposes, the light-altering material 32 is omitted. The mounting locations 18 of the leads 50-1 to 50-3 may be arranged at or even coplanar with the recess floor $24_{F2}$, thereby allowing the LED chips 26-1, 26-2 to be mounted below the recess floor $24_{F1}$. The difference between the depths of the recess floor $24_{F1}$ and the recess floor $24_{F2}$ may be tailored to a particular application to provide the top surfaces of the LED chips 26-1, 26-2 at a desired height within the recess $24_R$. In the example provided by FIG. 4C, the top surfaces of the LED chips 26-1, 26-2 may be arranged at heights that are greater than a height of the ridges 28 to provide wider emissions for the LED package 48. In other embodiments and depending on the targeted light emission pattern for the LED package 48, the top surfaces of the LED chips 26-1, 26-2 may be arranged at heights that are the same or lower than the height of the ridges 28 in a manner similar to FIG. 1D. In certain embodiments, sidewalls $28_S$ of the ridges 28 that face the LED chips 26-1, 26-2 may be angled to further control targeted emission patterns. For example, an angle of the sidewalls $28_S$ may be in a range from 30° to 90° from vertical depending on the desired light shaping. As illustrated in FIG. 4C, the sidewalls $28_S$ may have more of a slope defined by an angle in a range from 30° to 75°, or 45° to 75°, to provide wider emissions from the LED package 48.

FIG. 4D is a cross-section of the LED package 48 of FIG. 4B taken along the sectional line 4D-4D of FIG. 4B. As illustrated, the LED chips 26-1, 26-3, and 26-5 are all mounted to the same lead 50-1. In certain embodiments, the LED chips 26-1, 26-3, and 26-5 may have multiple bond pads 30 that may be configured as anode bond pads or alternatively configured as cathode bond pads. While the LED chips 26-1, 26-3, and 26-5 are illustrated with multiple bond pads 30, it is understood that each may include only a single bond pad 30 that is bonded to the lead 50-1. As illustrated in the cross-section of FIG. 4D, the ridges 28 of FIG. 4A are not visible, thereby allowing the recess sidewalls $24_S$ to extend all the way to the recess floor $24_{F2}$.

FIG. 4E is a cross-section of the LED package 48 from the perspective of FIG. 4C after the light-altering material 32 and an encapsulant 52 have been formed. As illustrated, the light-altering material 32 may be provided on the recess floor $24_{F1}$ in locations between the ridges 28 and the recess sidewalls $24_S$. In certain embodiments, the light-altering material 32 may initially be configured with a viscosity that promotes enough surface tension with the housing 24 that the light-altering material 32 may be formed with a generally curved surface that faces the LED chips 26-1, 26-2. The curved surface may extend from the ridges 28 to portions of the recess sidewalls $24_S$. After dispensing, the light-altering material 32 may be cured in place. By forming the light-altering material 32 with such curved surfaces, enhanced light shaping may be provided. The encapsulant 52 may comprise a material such as silicone or a resin that is generally light-transparent or light-transmissive to light generated within the LED package 48. In certain embodiments, lumiphoric materials 54, 56 may be provided within the encapsulant 52. In certain embodiments, the encapsulant 52 with the lumiphoric materials 54, 56 may be dispensed within the recess $24_R$ and the lumiphoric materials 54, 56 may be allowed to settle toward the bottom of the recess $24_R$ before the encapsulant 52 is cured. As such, the lumiphoric material 54 may embody a denser region of lumiphoric particles and the lumiphoric material 56 may embody a less dense region of lumiphoric particles within the encapsulant 52. The encapsulant 52 and the lumiphoric materials 54, 56 as described for the LED package 48 may be provided in any of the LED packages described above for FIGS. 1C to 1F, FIGS. 2C to 2D, and FIGS. 3C to 3D.

FIG. 5 is a cross-section of an LED package 58 that is similar to the LED package 48 of FIGS. 4A to 4E and further includes an additional layer of light-altering material 60 within the recess $24_R$. In certain embodiments, the additional layer of light-altering material 60 may be formed as a thin layer between the LED chips 26-1, 26-2 and the housing 24 to provide enhanced light reflection for downward emitted light. In FIG. 5, the light-altering material 60 is arranged to flood the recess floor $24_{F2}$ after the LED chips 26-1, 26-2 are mounted. In this regard, the light-altering material 60 may cover portions of the leads 50-1 to 50-3 that are outside the bond pads 30, 31. Additionally, the light-altering material 60 may cover portions of the housing 24 that are between the bond pads 30, 31 of each LED chip 26-1, 26-2. In other embodiments, the light-altering material 32 may be omitted. While the light-altering material 60 is described in the context of the LED package 58, the light-altering material 60 may be provided in any of the LED packages described above for FIGS. 1C to 1F, FIGS. 2C to 2D, and FIGS. 3C to 3D.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a housing that forms a recess with a recess floor and one or more recess sidewalls;
   a lead frame structure extending through the housing, the lead frame structure comprising a first lead, a second lead, and a third lead;
   a first LED chip that is flip-chip mounted to a mounting pad of the first lead and a mounting pad of the second lead;
   a second LED chip that is flip-chip mounted to another mounting pad of the second lead and a mounting pad of the third lead; and
   a plurality of anchoring features in each of the first lead, the second lead, and the third lead;
   wherein each of the mounting pads of the first lead, the second lead, and the third lead are surrounded on at least three edges by stress relief features of the lead frame structure.

2. The LED package of claim 1, wherein the stress relief features comprise one or more of notches and trenches in at least one of the first lead, the second lead, and the third lead.

3. The LED package of claim 1, wherein the stress relief features comprise notches that extend into the first lead in a first direction to define two opposing edges of the mounting pad of the first lead.

4. The LED package of claim 3, wherein the stress relief features further comprise a trench in the first lead that extends along a length of the first lead in a second direction that is perpendicular to the first direction, the trench defining a third side of the mounting pad that is between the two opposing edges.

5. The LED package of claim 4, wherein a fourth edge of the mounting pad of the first lead defines a portion of a gap between the mounting pad of the second lead.

6. The LED package of claim 1, wherein the plurality of anchoring features comprises openings in each of the first lead, the second lead, and the third lead, and portions of the housing reside within each of the openings.

7. The LED package of claim 6, wherein a first opening in the first lead includes an extension of the first opening that extends toward the mounting pad of the first lead.

8. The LED package of claim 1, wherein the stress relief features comprise a trench in the first lead that extends along a length of the first lead, and the plurality of anchoring features form openings in the first lead that reside within the trench.

9. The LED package of claim 1, wherein bottom edges of the first lead, the second lead, and the third lead are laterally recessed from edges of the mounting pads.

10. The LED package of claim 1, wherein the second lead forms a thermal pad that includes one or more openings, and portions of the housing reside within the one or more openings.

11. The LED package of claim 1, further comprising an electrical overstress element mounted on the first lead and electrically coupled to the third lead, wherein bottom edges of one or more of the first lead and the second lead are laterally recessed from a mounting pad of the electrical overstress element.

12. The LED package of claim 1, further comprising a ridge that extends upward from the recess floor.

13. The LED package of claim 12, wherein at least one of the first lead and the third lead form a mounting pad for an electrical overstress element, and the ridge extends between the electrical overstress element and the first LED chip.

14. The LED package of claim 13, further comprising:
an electrical overstress element mounted on the first lead and electrically coupled to the third lead; and
a light-altering material that is arranged to cover portions of the recess floor that are between the ridge and a sidewall of the recess, wherein the light-altering material is arranged to cover the electrical overstress element.

15. The LED package of claim 12, wherein a sidewall of the ridge that faces the first LED chip forms an angle from vertical that is in a range from 30 degrees to 75 degrees.

16. The LED package of claim 1, further comprising:
an electrical overstress element mounted on the first lead and electrically coupled to the third lead; and
a light-altering material that is arranged within only a portion of the recess floor, wherein the light-altering material is arranged to cover the electrical overstress element.

17. A light-emitting diode (LED) package comprising:
a housing that forms a recess with a first recess floor and a second recess floor that is arranged at a greater depth within the recess than the first recess floor;
a lead frame structure extending through the housing, the lead frame structure comprising a first lead, a second lead, and a third lead;
a first LED chip that is flip-chip mounted to a mounting pad of the first lead and a mounting pad of the second lead that are below the first recess floor;
a second LED chip that is flip-chip mounted to another mounting pad of the second lead and a mounting pad of the third lead that are below the first recess floor; and
a ridge that is arranged between the first recess floor and the second recess floor, wherein the ridge extends upward into the recess from the first recess floor and the second recess floor.

18. The LED package of claim 17, further comprising a light-altering material that is arranged to cover the first recess floor from the ridge to a sidewall of the recess.

19. The LED package of claim 18, wherein the light-altering material forms a curved surface from the ridge to the sidewall of the recess.

20. The LED package of claim 18, wherein the ridge is one of two ridges, the first LED chip and the second LED chip are arranged between the two ridges, and the light-altering material is arranged between the two ridges and the sidewall of the recess.

21. The LED package of claim 18, further comprising an additional light-altering material that is arranged between the second recess floor and the first LED chip.

22. The LED package of claim 17, wherein the recess forms a third recess floor that is arranged at a greater depth within the recess than the second recess floor, wherein the mounting pads of the first lead, the second lead, and the third lead are arranged at the third recess floor.

23. The LED package of claim 22, wherein a top surface of the first LED chip is arranged at a height that is the same or less than a height of the ridge.

24. The LED package of claim 17, wherein each of the mounting pads of the first lead, the second lead, and the third lead is surrounded on at least three edges by stress relief features of the lead frame structure.

25. The LED package of claim 17, further comprising an encapsulant in the recess, wherein the encapsulant comprises a lumiphoric material.

26. A light-emitting diode (LED) package comprising:
a housing that forms a recess with a recess floor and one or more recess sidewalls;
a lead frame structure extending through the housing, the lead frame structure comprising a first lead, a second lead, and a third lead;
a first LED chip that is flip-chip mounted to a mounting pad of the first lead and a mounting pad of the second lead;
a second LED chip that is flip-chip mounted to another mounting pad of the second lead and a mounting pad of the third lead; and
an electrical overstress element mounted on the first lead and electrically coupled to the third lead, wherein bottom edges of one or more of the first lead and the second lead are laterally recessed from a mounting pad of the electrical overstress element;
wherein each of the mounting pads of the first lead, the second lead, and the third lead are surrounded on at least three edges by stress relief features of the lead frame structure.

* * * * *